United States Patent [19]

Hasegawa et al.

[11] 4,378,259
[45] Mar. 29, 1983

[54] METHOD FOR PRODUCING MIXED CRYSTAL WAFER USING SPECIAL TEMPERATURE CONTROL FOR PRELIMINARY GRADIENT AND CONSTANT LAYER DEPOSITION SUITABLE FOR FABRICATING LIGHT-EMITTING DIODE

[75] Inventors: Shinichi Hasegawa; Hisanori Fujita, both of Ibaraki, Japan

[73] Assignee: Mitsubishi Monsanto Chemical Co., Tokyo, Japan

[21] Appl. No.: 219,722

[22] Filed: Dec. 24, 1980

[30] Foreign Application Priority Data

Dec. 28, 1979 [JP] Japan .................................. 54-173247

[51] Int. Cl.³ .................... H01L 21/20; H01L 21/324
[52] U.S. Cl. .................................... 148/175; 148/1.5; 148/171; 357/16; 357/17
[58] Field of Search ........................ 148/175, 171-173, 148/1.5; 357/16, 17

[56] References Cited

U.S. PATENT DOCUMENTS

| | | | |
|---|---|---|---|
| 3,224,913 | 12/1965 | Ruehrwein | 148/175 |
| 3,441,453 | 4/1969 | Conrad et al. | 148/175 |
| 3,493,811 | 2/1970 | Ewing | 148/175 |
| 3,696,262 | 10/1972 | Antypas | 148/175 X |
| 3,748,480 | 7/1973 | Coleman | 357/16 X |
| 3,862,859 | 1/1975 | Ettenberg et al. | 148/175 X |
| 3,962,716 | 6/1976 | Petroff et al. | 148/175 X |
| 3,995,303 | 11/1976 | Nahory et al. | 357/16 X |
| 4,053,920 | 10/1977 | Enstrom | 357/16 X |
| 4,088,515 | 5/1978 | Blakeslee et al. | 148/175 |
| 4,216,484 | 8/1980 | Hasegawa et al. | 357/17 |

OTHER PUBLICATIONS

Ewing et al., "Compositional Inhomogeneitics in GaAs P———Layers" J. Applied Physics, vol. 39, No. 13, Dec. 1968, pp. 5943-5948.

Primary Examiner—L. Dewayne Rutledge
Assistant Examiner—W. G. Saba
Attorney, Agent, or Firm—Sughrue, Mion, Zinn, Macpeak and Seas

[57] ABSTRACT

A method of manufacturing a mixed crystal compound semiconductor wafer suitable for the production of LED having a high light output. Upon a monocrystalline substrate of III-V semiconductor material a base layer is epitaxially grown of the same material as the substrate. An initial gradient layer is grown on the base layer having a mixed crystal ratio varying continuously from that of the base layer to a first value at a constant temperature. A combination sublayer is grown on the initial gradient sublayer which includes at least one constant sublayer having a constant crystal mixture ratio and at least one gradient sublayer having a crystal mixture ratio varying continuously between the mixed crystal ratios of its adjacent constant layers.

11 Claims, 1 Drawing Figure

METHOD FOR PRODUCING MIXED CRYSTAL WAFER USING SPECIAL TEMPERATURE CONTROL FOR PRELIMINARY GRADIENT AND CONSTANT LAYER DEPOSITION SUITABLE FOR FABRICATING LIGHT-EMITTING DIODE

BACKGROUND OF THE INVENTION

The present invention relates to a method of manufacturing a mixed crystal epitaxial wafer which is suitable for use as a material for manufacturing light emitting diode (hereinafter referred to as "LED") and which is made of compound semiconductor containing elements belonging to the III and V groups in the periodic table. This type of material is referred to as III-V semiconductor material or compounds hereinafter.

LED's which emit red or green light have been manufactured generally by using wafers of III-V semiconductor material such as GaAS, GaP and the like. LED's which emit intermediate colors between red and green, such as orange or yellow, have been manufactured using a mixed crystal epitaxial wafer of $GaAs_{1-x}P_x$ and the like. The use of mixed crystal epitaxial wafers provides the advantage that the forbidden energy gap, which determines the wavelength of the emitted light, can be varied by changing the mixed crystal ratio x.

In order to prevent crystal lattice dislocations between a monocrystalline substrate and the mixed crystal epitaxial layer during the growth of a mixed crystal epitaxial layer, a gradient layer is provided between the substrate and the epitaxial layer having a mixed crystal ratio which varies continuously in the thickness direction. For example, a mixed crystal epitaxial layer of $GaAs_{0.35}P_{0.65}$ (mixed crystal ratio $x=0.65$) suitable for manufacturing orange LED (peak wavelength emitted light 360 mn±10 nm) can be produced by epitaxially growing on a GaP monocrystalline substrate a layer portion in which the mixed crystal ratio x changes from 1 to 0.65 after which a layer having a constant value of $x=0.65$ is grown.

In this case, in order to keep various crystal defects, such as those referred to as pyramid, pit and void defects, as small as possible, it is necessary to maintain the epitaxial growth temperature, i.e., the temperature of the monocrystalline substrate, at a high temperature of around 900° C. or more. This high temperature reduces the speed of epitaxial layer growth. Further, in the conventional method, the mixed crystal ratio in the gradient layer varies continuously. Therefore, a crystal lattice dislocation between the substrate (GaP) and the epitaxial layer ($GaAs_{1-x}P_x$, $1>x>0$) cannot be removed sufficiently and thus the brightness (optical output) of a LED manufactured from such an epitaxial wafer is unsatisfactory.

A technique is known with which, during the growth of the gradient layer, the temperature of the monocrystalline substrate is varied in accordance with the value of x. However, with this technique, both the mixed crystal ratio, and hence the concentration of components contained in gas used for epitaxial growth, and the temperature of the monocrystalline substrate vary simultaneously and therefore an increase of crystal defect contained in the epitaxial layer being formed is unavoidable.

SUMMARY OF THE INVENTION

An object of the present invention is to provide a method of manufacturing a novel III-V compound mixed crystal semiconductor epitaxial wafer with a minimum of crystal lattice dislocations.

The above object and other objects of the invention are achieved by providing an epitaxial wafer comprising a monocrystalline substrate and a mixed crystal III-V semiconductor layer epitaxially grown on a surface of the substrate in which the III-V semiconductor layer comprises a constant layer, that is, a layer having a constant mixed crystal ratio, and a gradient layer having a varying mixture ratio. The gradient layer is divided into at least two gradient sub-layers. The provision of such an epitaxial wafer is achieved by forming, during the formation of the gradient layer on the substrate which is maintained at a constant temperature, at least one constant mixed crystal ratio layer within the gradient layer by changing the substrate temperature.

BRIEF DESCRIPTION OF THE DRAWINGS

The single FIGURE shows a cross section of a model of semiconductor wafer formed according to a preferred embodiment of the present invention.

DESCRIPTION OF THE PREFERRED EMBODIMENTS

Figure 1:
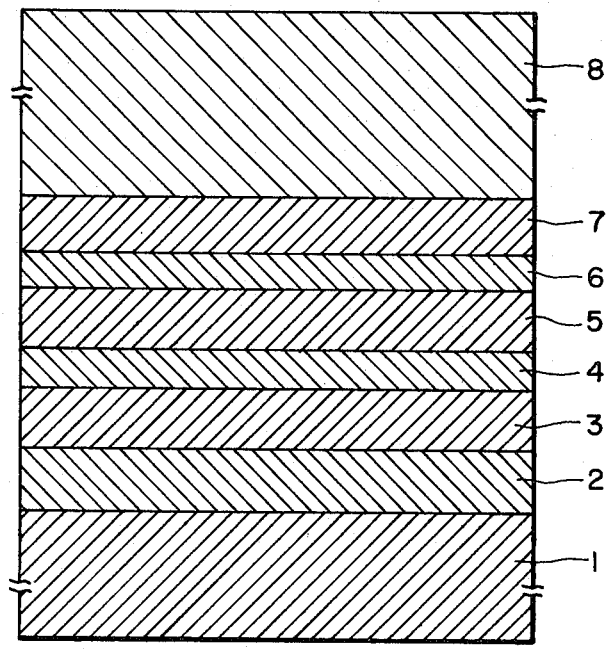

The single FIGURE illustrates a cross section of an epitaxial wafer manufactured according to the present invention.

In the FIGURE, a substrate 1 is made of a monocrystalline semiconductor material such as GaAs, GaP, InP, and the like which belongs to the III-V group in the periodic table. It is preferable to select a material having a crystal lattice constant which is as close as possible to that of the mixed crystal to be formed thereon. A Ge or Si monocrystalline substrate may also be used if desired.

On the monocrystalline substrate 1, an epitaxial layer 2 of the same material as that of the substrate is formed to remove crystal defects which may exist on the surface of the substrate 1. In epitaxially growing the layer 2, it is desirable to reduce the initial growth rate of the layer 2 by using a high temperature. This is necessary to obtain good crystallization. For example, when the material of the monocrystalline substrate 1 is GaP, the layer 2 of GaP can be epitaxially grown by maintaining the temperature of the substrate 1 initially at 900° C. to 970° C. Generally, the substrate temperature should be lowered to accelerate growth after the thickness of the epitaxial layer 2 has reached 1 to 3 μm.

A first gradient layer 3 having a varying mixed crystal ratio is grown at a constant substrate temperature. Due to the constant temperature, the mixed crystal ratio of the layer 3 does not vary to the desired value, namely, the value of a layer 8 to be described layer, but to an intermediate value. Then, a constant layer 4 having a constant crystal mixture ratio is formed on the layer 3. The substrate temperature is further lowered to increase the growth rate during the epitaxial formation of the layer 4.

On the layer 4, a second gradient layer 5 having a varying mixed crystal ratio is formed while keeping the substrate temperature constant as in the case of the layer 3. Thereafter, a second constant layer 6 having a constant mixed crystal ratio is grown on the layer 5. It is possible to increase the growth rate of the layer 6 by further lowering the substrate temperature. Then, a third gradient layer 7 is formed and thereafter a constant layer 8 is formed thereon in which a PN junction is suitably formed.

The formation of the layers 7 and 8 is carried out at a constant substrate temperature. The total thickness of the multi-layered wafer thus formed is about 40 μm to 100 μm. The temperature of the substrate during the formation of the layers 7 and 8 is preferably 760° C. to 870° C. for a $GaAs_{1-x}P_x$ mixed crystal. In choosing the precise temperature actually used, it should be noted that, in general, a higher substrate temperature provides better crystallization while a lower temperature enhances the growth rate.

The thickness of the layer 8 is preferably from 50 μm to 100 μm. When the constant layer 8 is of the indirect transition type, for example, if $GaAs_{1-x}P_x (0.45 \leq x \leq 1)$ is used, the PN junction is preferably formed after doping with nitrogen to form iso-electron traps.

Although in the above example three gradient sub-layers are described as constituting the gradient layer, the number of the gradient sub-layers is arbitrary and two sub-layers or more than three sub-layers may be used to constitute the gradient layer.

According to the present invention, it is possible to manufacture epitaxial wafers free from various crystal defects without lowering the production rate. Moreover, the brightness of a LED manufactured from a wafer of the invention is about 1.7 times that of a LED manufactured conventionally when measured under the same conditions.

The present invention will be described in more detail with reference to the following examples.

EXAMPLE 1

A GaP monocrystalline substrate containing $2 \times 10^{17}$ atoms/cm$^3$ of sulfur as an n type impurity and having a plane misoriented 6° off from the (100) plane toward the <110> direction was prepared. The initial thickness of the GaP substrate was about 360 μm which was reduced to 270 μm by cleansing with an organic solvent and subsequent mechanical-chemical polishing.

The polished GaP monocrystalline substrate and a quartz boat containing high purity Ga were set in predetermined locations in a horizontal-type quartz epitaxial reaction chamber having an inner diameter of 70 mm and a length of 100 cm (total volume≃3.85 l).

Argon gas was introduced into the epitaxial reaction chamber enough to replace air therein with argon gas. Then high purity hydrogen gas was introduced as a carrier gas into the reaction chamber at a flow rate of 2500 ml/min (650 ml/l/min relative to the volume of the reaction chamber), while the introduction of Ar gas was stopped and the temperature increased. After it was confirmed that the temperature at the locations at which the quartz boat containing Ga and the GaP monocrystalline substrate were set were 760° C. and 950° C., respectively, the epitaxial growth of an epitaxial multi-layered wafer of $GaAs_{0.35}P_{0.65}$ was started.

H$_2$S gas diluted with nitrogen gas to a concentration of 30 ppm was introduced as an n-type impurity into the reaction chamber at the start of the epitaxial growth at a rate of 10 ml/min (2.6 ml/l/min relative to the volume of the reaction chamber). Simultaneously therewith, high purity hydrogen chloride (HCl) gas was introduced to transport III group component Ga into the reaction chamber at a rate of 40 ml/min (10.4 ml/l/min) to react with Ga to thereby completely convert it into GaCl. Phosphine (PH$_3$) gas diluted with hydrogen gas to a concentration of 12% was introduced into the reaction at a rate of 220 ml/min (57 ml/l/min). Under these conditions, the growth temperature corresponding to the substrate temperature was kept at 950° C. for the initial 10 minutes to form a GaP epitaxial layer on the GaP monocrytalline substrate. Then, for the subsequent 10 minutes, the GaP epitaxial layer was grown while the temperature was gradually lowered to 930° C. The first constant layer was thus formed.

During the subsequent 20 minutes, the growth temperature was kept at 930° C. and arsine (AsH$_3$) gas diluted with hydrogen gas to a concentration of 12% was introduced gradually at an increasing rate from 0 ml/min to 40 ml/min (10.4 ml/l/min). Thus, with the above-mentioned gases, a second $GaAs_{1-x}P_x$ layer was epitaxially grown on the first epitaxial layer.

During the subsequent 10 minutes, the temperature was gradually lowered from 930° C. to 910° C. while the introduction rates of H$_2$, H$_2$S, HCl, PH$_3$ and AsH$_3$ gases were kept at 2500 ml/min (650 ml/l/min), 10 ml/min (2.6 ml/l/min), 40 ml/min (10.4 ml/l/min), 220 ml/min (57 ml/l/min) and 40 ml/min (10.4 ml/l/min), respectively. In this manner, a third $GaAs_{1-x}P_x$ layer was formed epitaxially on the second epitaxial layer.

For a subsequent 20 minutes, the temperature was kept at 910° C. and the introduction rates of H$_2$, H$_2$S, HCl and PH$_3$ were held at 2500 ml/min (650 ml/l/min), 10 ml/min (2.6 ml/l/min), 40 ml/min (10.4 ml/l/min) and 220 ml/min (57 ml/l/min), respectively. For the same period, only the rate of AsH$_3$ was increased gradually from 40 ml/min (10.4 ml/l/min) to 80 ml/min (20.8 ml/l/min). In this way, a fourth epitaxial $GaAs_{1-x}P_x$ layer was epitaxially formed on the third layer. Then, for a subsequent 10 minutes, the introduction rates of H$_2$, H$_2$S, HCl, PH$_3$ and AsH$_3$ were kept at 2500 ml/min (650 ml/l/min), 10 ml/min (2.6 ml/l/min), 40 ml/min (10.4 ml/l/min), 220 ml/min (57 ml/l/min) and 80 ml/min (20.8 ml/l/min) while the temperature was gradually reduced from 910° C. to 890° C. A fifth $GaAs_{1-x}P_x$ epitaxial layer was thus formed on the fourth epitaxial layer.

During a subsequent 20 minutes, the introduction rates of H$_2$, H$_2$S, HCl and PH$_3$ gases were held at 2500 ml/min (650 ml/l/min), 10 ml/min (2.6 ml/l/min), 40 ml/min (10.4 ml/l/min) and 220 ml/min (57 ml/l/min), respectively and the temperature was maintained at 890° C. For the same period, only the introduction rate of AsH$_3$ was increased. This was done gradually from 80 ml/min (20.8 ml/l/min) to 120 ml/min (31.2 ml/l/min). A sixth $GaAs_{1-x}P_x$ layer was thereby formed on the fifth epitaxial layer.

During a subsequent 40 minutes, the introduction rates of H$_2$, H$_2$S, HCl, PH$_3$ and AsH$_3$ were kept at 2500 ml/min (650 ml/l/min), 10 ml/min (2.6 ml/l/min), 40 ml/min (10.4 ml/l/min), 220 ml/min (57 ml/l/min) and 120 ml/min (31.2 ml/l/min), respectively, and the temperature was held at 890° C. Thus a seventh $GaAs_{0.35}P_{0.65}$ layer was epitaxially formed on the sixth layer.

During a subsequent 40 minutes, the same conditions as in the preceding 40 minute period for the seventh layer formation were maintained and high purity NH$_3$ gas was newly introduced into the reaction chamber at a rate of 200 ml/min (52 ml/l/min). Thus an eighth $GaAs_{1-x}P_x$ epitaxial layer doped with nitrogen to form iso-electronic traps was formed on the seventh epitaxial layer at which point the process of forming the epitaxial multi-layered wafer was completed.

The wafer thus formed was tested and analyzed for various properties. The thicknesses of the first, second, third, fourth, fifth, sixth, seventh and eighth layers were 2.6 μm, 3.0 μm, 8.5 μm, 4.5 μm, 9.7 μm, 5.0 μm, 12.1 μm, 21.4 μm and 22.0 μm, respectively, and the forbidden band energy gaps (minimum) of the first, second, third, fourth, fifth, sixth, seventh and eighth layers were 2.26 eV (constant), 2.26 eV (constant), 2.26 eV to 2.21 eV (variable), 2.21 eV (constant), 2.21 eV to 2.15 ev (variable), 2.15 eV (constant), 2.15 eV to 2.09 eV (variable), 290 eV (constant) and 2.09 eV (constant), respectively, with a nitrogen concentration of $9 \times 10^{18}$ cm$^{-3}$.

The n-type carrier concentration was aboout $6 \times 10^{16}$ cm$^{-3}$ for the first to seventh layers and was $2.4 \times 10^{16}$ cm$^{-3}$ for the eighth layer containing nitrogen.

The epitaxial wafer thus formed was vacuum-sealed together with 2.5 mg of $ZnAs_2$ as a p-type impurity in a boat of high purity quartz and thermal diffusion of the impurity was performed at 720° C. The depth of a PN junction thus obtained was 4.3 μm from the surface of the wafer. An orange-light emitting diode chip was produced from the wafer by the steps of substrate side polishing, electrode forming and wire bonding, etc. which are by themselves well known.

A DC current density of 10 A/cm² was passed through the diode chip (chip area 500 μm × 500 μm and PN junction area 500 μm × 500 μm) and the chip, without epoxy resin coating, was measured for the brightness. The test results showed that the brightness was from 3670 ft.L (foot Lamberts) to 4680 ft.L at a peak emission wavelength of 6320±15 nm with an average of 4130 ft.L which is about twice that of the conventional diode.

EXAMPLE 2

An n-type GaP monocrystalline substrate doped with sulfur at $10^{17}$ atoms/cm³ and having a plane shifted from the (100) plane in the <110> direction by about 5° was prepared and placed in the same reaction chamber as that used in Example 1.

While gradually lowering the growth temperature from 955° C. to 930° C. for 7 minutes, $H_2S$ gas diluted with nitrogen gas to 30 ppm, hydrogen as a carrier gas, HCl to transport the III group component Ga as GaCl, and 12% $PH_3$ gas as the V group component were introduced into the reaction chamber at rates of 13 ml/min (3.4 ml/l/min), 2700 ml/min (700 ml/l/min), 44 ml/min (11.4 ml/l/min) and 245 ml/min (64 ml/l/min), respectively. Thus, a first GaP epitaxial layer was formed on the substrate.

During a subsequent 14 minutes, the respective gas introductions were maintained and the temperature was kept at 930° C. During this period, 12% $AsH_3$ was newly introduced gradually into the reaction chamber at an increasing rate from zero to 47 ml/min (12.2 ml/l/min). In this manner, a second $GaAs_{1-x}P_x$ epitaxial layer was formed on the first layer.

During a subsequent 7 minutes, while the introduction rates of $H_2$, $H_2S$, HCl, $PH_3$, and $AsH_3$ were maintained at 2700 ml/min (700 ml/l/min), 13 ml/min (3.4 ml/l/min), 44 ml/min (11.4 ml/l/min), 245 ml/min (64.4 ml/l/min) and 47 ml/min (12.2 ml/l/min), the temperature was gradually decreased from 930° C. to 905° C. Thus, a third $GaAs_{1-x}P_x$ epitaxial layer was formed on the second layer.

During a subsequent 14 minutes, while the temperature and the introduction rates of $H_2$, $H_2S$, HCl and $PH_3$ were held unchanged at 905° C., 2700 ml/min (700 ml/l/min), 13 ml/min (3.4 ml/l/min), 44 ml/min (11.4 ml/l/min) and 245 ml/min (64.4 ml/l/min), respectively, the introduction rate of $AsH_3$ was gradually increased from 47 ml/min (12.2 ml/l/min) to 94 ml/min (24.4 ml/l/min) to thus form a fourth $GaAs_{1-x}P_x$ epitaxial layer on the third layer.

During a subsequent 7 minutes, while the introduction rates of $H_2$, $H_2S$, HCl, $PH_3$ and $AsH_3$ were kept at 2700 ml/min (700 ml/l/min), 13 ml/min (3.4 ml/l/min), 44 ml/min (11.4 ml/l/min), 245 ml/min (64.4 ml/l/min) and 94 ml/min (24.4 ml/l/min), respectively, the temperature was gradually lowered from 905° C. to 880° C. Accordingly, a fifth $GaAs_{1-x}P_x$ epitaxial layer was formed on the fourth layer.

During a subsequent 14 minutes, while the introduction rates of $H_2$, $H_2S$, HCl and $PH_3$ were kept at 2700 ml/min (700 ml/l/min), 13 ml/min (2.4 ml/l/min), 44 ml/min (11.4 ml/l/min) and 245 ml/min (64.4 ml/l/min), respectively, and the temperature was kept at 880° C., the introduction rate of $AsH_3$ was gradually increased from 94 ml/min (24.4 ml/l/min) to 141 ml/min (36.6 ml/l/min). Thus, a sixth $GaAs_{1-x}P_x$ epitaxial layer was formed on the fifth layer.

During a subsequent 30 minutes, while the temperature was held at 880° C. and the introduction rates of $H_2$, $H_2S$, HCl, $PH_3$ and $AsH_3$ were kept at 2700 ml/min (2700 ml/l/min), 13 ml/min (3.4 ml/l/min), 44 ml/min (11.4 ml/l/min), 245 ml/min (64.4 ml/l/min) and 141 ml/min (36.6 ml/l/min), $NH_3$ gas was newly introduced into the epitaxial reactor at a rate of 200 ml/min (52 ml/l/min). Thus a seventh $GaAs_{1-x}P_x$ epitaxial layer was formed on the sixth layer and the process of multilayered epitaxial wafer formation was completed.

The thicknesses of the first, second, third, fourth, fifth, sixth and seventh layers thus formed were 3.3 μm, 9.9 μm, 4.9 μm, 11.5 μm, 6.0 μm, 13.3 82 m and 28.0 μm, respectively, and the corresponding forbidden band energy gaps (minimum) were 2.26 eV (constant), 2.26 eV to 2.20 eV (variable), 2.20 eV (constant), 2.20 eV to 2.14 eV (variable), 2.14 eV (constant), 2.14 eV to 2.08 eV (variable) and 2.08 eV (constant) with a nitrogen concentration of $1 \times 10^{19}$ cm$^{-3}$.

An orange light emitting diode was produced from the multi-layered epitaxial wafer thus formed in a similar way to that of Example 1 and the brightness thereof was measured.

A DC current density of 10 A/cm² was passed through the LED chip (chip area 500 μm × 500 μm and PN junction area 500 μm × 500 μm) without an epoxy resin coating. The measured brightness ranged from 3280 ft.L to 4210 ft.L with an average of 3820 ft.L at the peak emission wavelength of 6350≃20 nm. This is about 1.8 times that of a conventional diode.

What is claimed is:

1. A method of manufacturing a mixed crystal compound semiconductor wafer for light emitting diodes which is constituted of III and V elements in the periodic table comprising the steps of: providing a monocrystalline substrate of III-V semiconductor material; epitaxially growing a base layer of the same material as that of said substrate on said substrate; epitaxially growing on said base layer an initial gradient sublayer having a mixed crystal ratio varying continuously from that of said base layer to a first intermediate value at a constant temperature; and epitaxially growing on said initial gradient sublayer at least one combination sublayer including a constant sublayer having a constant mixed crystal ratio corresponding to said first value and a gradient sublayer formed on said constant sublayer and having a mixed crystal ratio continuously varying from said first intermediate value to that of a subsequent constant layer to be formed thereon, the epitaxial growth of said constant sublayer being performed at a varying temperature and the epitaxial growth of said gradient sublayer being performed at a constant temperature.

2. The method as claimed in claim 1 wherein a plurality of said combination sublayers are epitaxially provided, said constant sublayer of a first combination sublayer having a constant mixed crystal ratio corresponding to said first value and a gradient sublayer of a last combination sublayer having a mixed crystal ratio varying continuously to that of an adjacent constant layer, said adjacent constant layer having a PN junction formed therein.

3. The method as claimed in claim 2 wherein the number of said combination sublayer is three.

4. The method as claimed in claim 2 wherein the number of said combination sublayers is four.

5. The method as claimed in claim 2 wherein the number of said combination sublayers is five.

6. A method of manufacturing a mixed crystal compound semiconductor wafer for light emitting diodes comprising the steps of: providing a wafer of a semiconductor material selected from the group consisting of GaAs, GaP and InP; epitaxially growing a layer of the same semiconductor material as that of said substrate on said substrate; epitaxially growing a first gradient layer having a varying mixed crystal ratio at a constant substrate temperature with said mixed crystal ratio varying to an intermediate value from the mixed crystal ratio of said first-mentioned layer; epitaxially growing a first constant layer having a constant mixed crystal ratio on said first gradient layer; epitaxially growing a second gradient layer on said first constant layer while holding the substrate temperature constant; epitaxially growing a second constant layer having a mixed crystal ratio on said second gradient layer; epitaxially growing a third gradient layer on said second constant layer at a constant substrate temperature; and growing a third constant layer on said third gradient layer, a PN junction being formed in said third constant layer, said first and second constant layers being grown at a varying temperature and said third constant layer being epitaxially grown at a constant substrate temperature.

7. The method of claim 6 wherein said semiconductor material comprises $GaAs_{1-x}P_x$ and wherein the temperature of said substrate during the formation of said third gradient layer and said third constant layer is in a range of 760° C. to 870° C.

8. The method of claim 7 wherein the thickness of said third constant layer is in a range of 50 μm to 100 μm.

9. The method of claim 8 further comprising the step of doping with nitrogen during said step of epitaxially growing said third constant layer prior to the formation of said PN junction.

10. A method of manufacturing a mixed crystal compound semiconductor wafers for light emitting diodes comprising the steps of: providing a GaP monocrystalline substrate doped with $2 \times 10^{17}$ atoms/cm$^3$ of sulfur and having a plane oriented 6° from the (100) plane toward the <110> direction; cleansing and mechanically-chemically polishing said substrate; disposing said substrate and high purity metallic Ga in a quartz boat in a horizontal-type quartz epitaxial reaction chamber; purging said reaction chamber of air; introducing high purity hydrogen gas into said reaction chamber at a flow rate of 650 ml/l/min relative to the volume of said reaction chamber; heating said high purity metallic Ga to a temperature of 760° C. and said substrate to a temperature 950° C.; introducing H$_2$S gas diluted with nitrogen gas to a concentration of 30 ppm into said reaction chamber at a rate of 2.6 ml/l/min; simultaneously introducing high purity HCl gas into said reaction chamber at a rate 10.4 ml/l/min; introducing PH$_3$ gas into said reaction chamber diluted with hydrogen gas to a concentration of 12% at a flow rate of 57 ml/l/min; maintaining said temperature of said substrate at 950° C. for 10 minutes to form a GaP epitaxial layer on said substrate; lowering said temperature of said substrate to 930° C. over a 10 minute period to form a first constant layer; maintaining said temperature of said substrate at 930° C. for 20 minutes while introducing AsH$_3$ gas diluted with hydrogen gas to a concentration of 12% gradually at an increasing rate from 0 ml/l/min to 10.4 ml/l/min; gradually lowering said temperature of said substrate during a 10 minute period from 930° C. to 910° C. while maintaining constant the introduction rates of said hydrogen, said H$_2$S, HCl, PH$_3$ and AsH$_3$ gases; maintaining said temperature of said substrate at 910° C. for 20 minutes while maintaining said introduction rates of said hydrogen, H$_2$S, HCl and PH$_3$ gases while gradually increasing said introduction rate of AsH$_3$ gas to 20.8 ml/l/min; maintaining said introduction rates of said hydrogen, H$_2$S, HCl, PH$_3$ and AsH$_3$ gases while lowering said temperature of said substrate from 910° C. to 890° C. during a 10 minute period; maintaining said introduction rates of said hydrogen, H$_2$S, HCl and PH$_3$ gases and said temperature at 890° C. for 20 minutes while increasing said introduction rate of said AsH$_3$ gas to 31.2 ml/l/min; maintaining said introduction rates of said hydrogen, H$_2$S, HCl, PH$_3$ and A$_s$H$_3$ gases and said temperature of said substrate at 890° C. for 40 minutes; maintaining said introduction rates of said hydrogen, H$_2$S, HCl, PH$_3$ and AsH$_3$ gases and said temperature of said substrate at 890° C. for 40 minutes while introducing high purity NH$_3$ gas at a rate of 52 ml/l/min; placing said wafer thus formed in a vacuum-sealed chamber with ZnAs$_2$ in a boat of high purity quartz; heating substrate to a temperature of 720° C. to form a PN junction; and dividing said wafer into diode chips.

11. A method of manufacturing a mixed crystal compound semiconductor wafers for light emitting diodes comprising the steps of: providing a GaP monocrystalline substrate doped with $2 \times 10^{-17}$ atoms/cm$^3$ of sulfur and having a plane oriented 6° from the (100) plane toward the <110> direction; cleansing and mechanically-chemically polishing said substrate; disposing said substrate and high purity Ga in a quartz boat in a horizontal-type quartz epitaxial reaction chamber; purging said reaction chamber of air; introducing high purity hydrogen gas into said reaction chamber at a flow rate of 700 ml/l/min relative to the volume of said reaction chamber; heating said substrate to a temperature 955° C.; introducing H$_2$S diluted with nitrogen gas to a concentration of 30 ppm into said reaction chamber at a rate of 3.4 ml/l/min, simultaneously introducing high purity HCl gas into said reaction chamber at a rate 11.4 ml/l/min, and introducing PH$_3$ gas into said reaction chamber diluted with hydrogen gas to a concentration of 12% at a flow rate of 64 ml/l/min, while gradually lowering said temperature of said substrate to 930° during a 7 minute period to form a GaP epitaxial layer on said substrate; maintaining said temperature of said substrate at 930° C. for 14 minutes while introducing AsH$_3$ gas diluted with hydrogen gas to a concentration of 12% gradually at an increasing rate from 0 ml/l/min to 12.2 ml/l/min; gradually lowering said temperature of said substrate during a 7 minute period from 930° to 905° C. while maintaining constant the introduction rates of said hydrogen, said H$_2$S, HCl, PH$_3$ and AsH$_3$ gases; maintaining said temperature of said substrate at 905° C. for 14 minutes while maintaining said introduction rates of said hydrogen, H$_2$S, HCl and PH$_3$ gases while gradually increasing said introduction rate of AsH$_3$ gas to 24.4 ml/l/min; maintaining said introduction rates of said hydrogen, H$_2$S, HCl, PH$_3$ and AsH$_3$ gases while lowering said temperature of said substrate from 905° C. to 880° C. during a 7 minute period; maintaining said introduction rates of said hydrogen, H$_2$S, HCl and PH$_3$ gases and said temperature at 880° C. for 14 minutes while increasing said introduction rate of said AsH$_3$ gas to 36.6 ml/l/min; maintaining said introduction rates of said hydrogen, H$_2$S, HCl, PH$_3$ and AsH$_3$ gases and said temperature of said substrate at 880° C. for 30 minutes while introducing high purity NH$_3$ gas at a rate of 52 ml/l/min; placing said wafer thus formed in a vacuum-sealed chamber with ZnAs$_2$ in a boat of high purity quartz; heating said substrate to a temperature of 720° C. to form a PN junction; and dividing said wafer into diode chips.

* * * * *